United States Patent
Xie et al.

(10) Patent No.: US 10,790,376 B2
(45) Date of Patent: Sep. 29, 2020

(54) CONTACT STRUCTURES

(71) Applicant: GLOBALFOUNDRIES INC., Grand Cayman (KY)

(72) Inventors: Ruilong Xie, Niskayuna, NY (US); Chanro Park, Clifton Park, NY (US); Julien Frougier, Albany, NY (US); Kangguo Cheng, Schenectady, NY (US); Andre P. Labonte, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/105,102

(22) Filed: Aug. 20, 2018

(65) Prior Publication Data

US 2020/0058757 A1     Feb. 20, 2020

(51) Int. Cl.
*H01L 21/00*     (2006.01)
*H01L 29/66*     (2006.01)
*H01L 29/417*    (2006.01)
*H01L 21/8234*   (2006.01)
*H01L 29/45*     (2006.01)
(Continued)

(52) U.S. Cl.
CPC ........ *H01L 29/665* (2013.01); *H01L 21/0273* (2013.01); *H01L 21/02271* (2013.01); *H01L 21/02532* (2013.01); *H01L 21/26513* (2013.01); *H01L 21/28518* (2013.01); *H01L 21/31116* (2013.01); *H01L 21/76802* (2013.01); *H01L 21/76877* (2013.01); *H01L 21/76897* (2013.01); *H01L 21/823431* (2013.01); *H01L 21/823437* (2013.01); *H01L 21/823468* (2013.01); *H01L 21/823475* (2013.01); *H01L 27/0886* (2013.01); *H01L 29/41775* (2013.01); *H01L 29/42372* (2013.01); *H01L 29/456* (2013.01); *H01L 21/31053* (2013.01); *H01L 21/32134* (2013.01); *H01L 21/76831* (2013.01);
(Continued)

(58) Field of Classification Search
CPC ............. H01L 29/665; H01L 21/02271; H01L 21/02532; H01L 21/0273
See application file for complete search history.

(56) References Cited

U.S. PATENT DOCUMENTS 9,147,576 B2   9/2015   Horak et al.
9,691,897 B2   6/2017   Xie et al.
(Continued)

OTHER PUBLICATIONS

Specification and Drawings "Hybrid Spacer Integration for Field-Effect Transistors Background" for U.S. Appl. No. 15/800,563, filed Nov. 1, 2017, 30 Pages.

(Continued)

*Primary Examiner* — Mounir S Amer
*Assistant Examiner* — Alexander Belousov
(74) *Attorney, Agent, or Firm* — Francois Pagette; Andrew M. Calderon; Roberts Calderon Safran & Cole, P.C.

(57) ABSTRACT

The present disclosure generally relates to semiconductor structures and, more particularly, to contact structures and methods of manufacture. The structure includes: a plurality of gate structures comprising source and drain regions and sidewall spacers; contacts connecting to at least one gate structure of the plurality of gate structures; and at least one metallization feature connecting to the source and drain regions and extending over the sidewall spacers.

17 Claims, 6 Drawing Sheets

(51) Int. Cl.
*H01L 21/768* (2006.01)
*H01L 27/088* (2006.01)
*H01L 21/027* (2006.01)
*H01L 21/311* (2006.01)
*H01L 21/02* (2006.01)
*H01L 21/265* (2006.01)
*H01L 21/285* (2006.01)
*H01L 29/423* (2006.01)
*H01L 29/51* (2006.01)
*H01L 29/49* (2006.01)
*H01L 21/3105* (2006.01)
*H01L 21/3213* (2006.01)

(52) U.S. Cl.
CPC .... *H01L 21/76843* (2013.01); *H01L 29/4966* (2013.01); *H01L 29/517* (2013.01)

(56) References Cited

U.S. PATENT DOCUMENTS

2017/0054004 A1    2/2017  Cheng et al.
2017/0317076 A1*  11/2017  Shen ............... H01L 21/823475

OTHER PUBLICATIONS

Specification and Drawings "Gate Contact Structure Positioned Above an Active Region of a Transistor Device" for U.S. Appl. No. 15/876,316, filed Jan. 22, 2018, 70 pages.

\* cited by examiner

CONTACT STRUCTURES

FIELD OF THE INVENTION

The present disclosure generally relates to semiconductor structures and, more particularly, to contact structures and methods of manufacture.

BACKGROUND

As semiconductor processes continue to scale downwards, e.g., shrink, the desired spacing between features (i.e., the pitch) also becomes smaller. To this end, in the smaller technology nodes it becomes ever more difficult to fabricate front end of line (FEOL), back end of line (BEOL) and middle of line (MOL) features due to the critical dimension (CD) scaling and process capabilities, as well as materials that are used to fabricate such structures.

Currently, contacts over the active regions require a relatively tall self-aligned contact gate cap, e.g., greater than 55 nm. However, these cap sizes are not viable as technology nodes shrink given the gate length and the pitch needed for these nodes.

SUMMARY

In an aspect of the disclosure, a structure comprises: a plurality of gate structures comprising source and drain regions and sidewall spacers; contacts connecting to at least one gate structure of the plurality of gate structures; and at least one metallization feature connecting to the source and drain regions and extending over the sidewall spacers.

In an aspect of the disclosure, a structure comprises: a gate structure comprising over-etched sidewall spacers, source and drain regions, and a gate contact; a misaligned source and drain contact connecting to the source and drain regions and extending over the over-etched sidewall spacers; and a liner over the gate contacts and the misaligned source and drain contact.

In an aspect of the disclosure, a method comprises: forming a plurality of gate structures comprising source and drain regions, gate materials and sidewall spacers; depositing a sacrificial layer over the gate structures having an etch selectivity different than the sidewall spacers; depositing a capping material over the source and drain regions; depositing a dielectric layer over the sacrificial layer and the capping material; etching a trench in the dielectric layer over selective source and drain regions; depositing a metal material within the trench to form a source and drain contact; removing the sacrificial layer to expose the gate materials; forming a gate contact to selective gate structures; and forming a liner over the gate structures and the source and drain regions.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure generally relates to semiconductor structures and, more particularly, to contact structures and methods of manufacture. In embodiments, the processes and structures described herein provide a sacrificial cap having an etch selectivity selective to surrounding materials so as to allow for shrinking technology nodes. Advantageously, by having different a etch selectivity, the metallization features of the gate structures and the source and drain (S/D) regions can be formed without a concern for shorting, even if an over etching occurs during fabrication. In this way, the structures and processes described herein allow for structures to be fabricated in advanced technology nodes, i.e., 7 nm and beyond.

In embodiments, a method to form gate contacts over active regions comprises: forming a T-shaped α-Si cap; forming an S/D contact; recessing the S/D contact; forming an S/D cap and polishing a top portion of the T-shaped α-Si cap; forming self-aligned openings to the S/D regions and a gate structure; metallizing the S/D regions and the gate structure; removing a top interlevel dielectric (ILD) layer and the α-Si cap; and forming a dielectric liner and a low-k dielectric.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii) applying a patterned mask on top of the films by photolithographic imaging, and (iii) etching the films selectively to the mask.

Figure 1A:
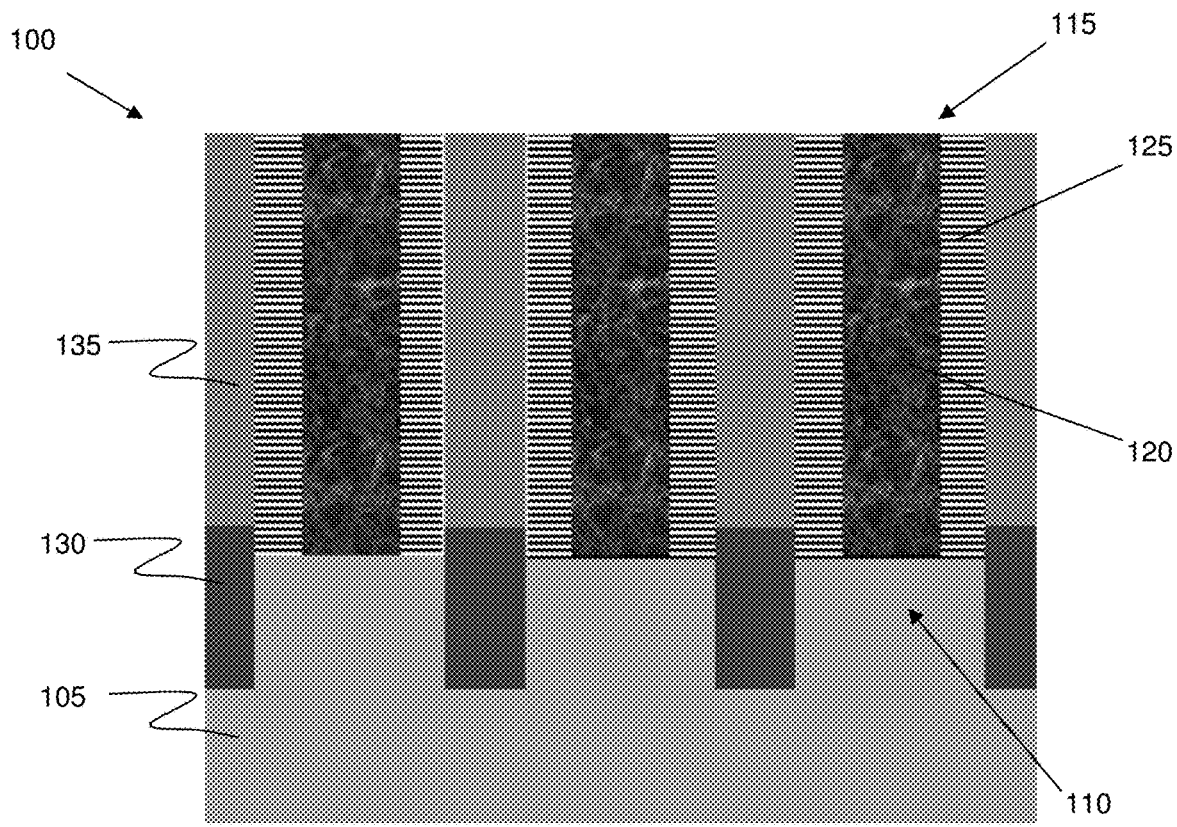
FIGS. 1A and 1B show gate structures, amongst other features, and respective fabrication processes in accordance with aspects of the present disclosure.
Figure 1B:
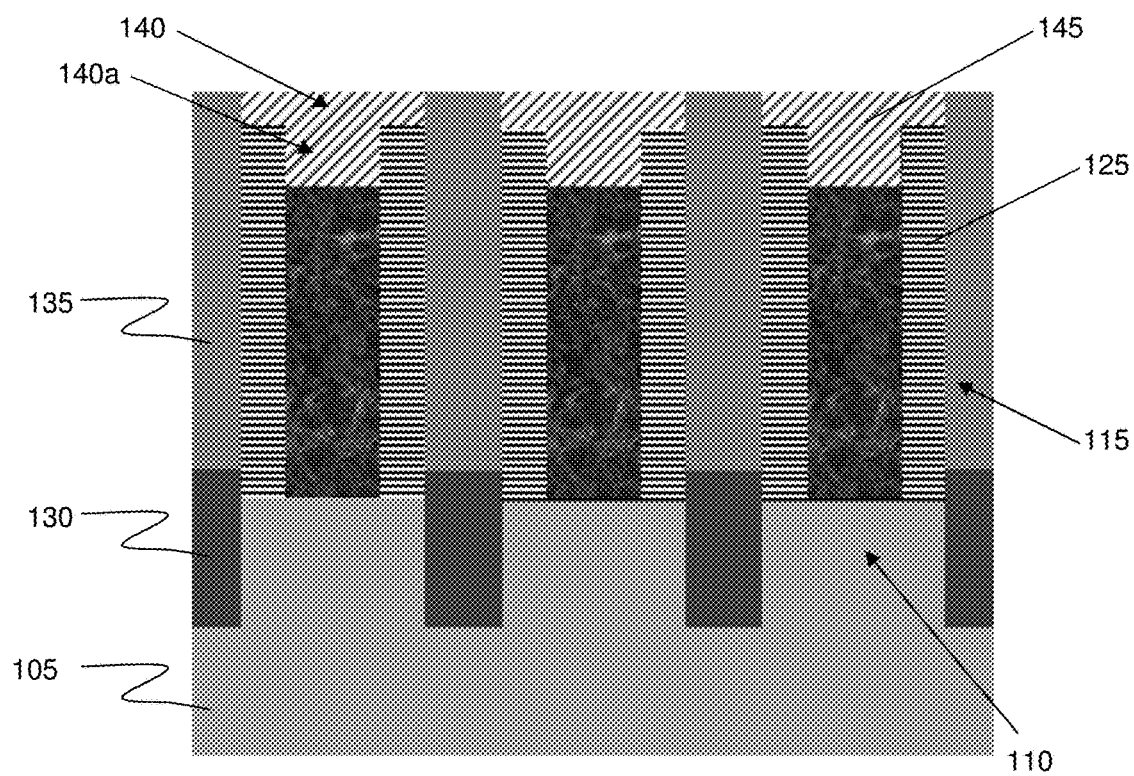

FIGS. 1A and 1B show an incoming structure and respective fabrication processes in accordance with aspects of the present disclosure. More specifically, FIG. 1A shows a structure 100, which comprises a substrate 105 composed of a suitable semiconductor material. For example, the substrate 105 may be composed of any suitable material including, but not limited to, Si, SiGe, SiGeC, SiC, GaAs, InAs, InP, etc. In embodiments, the substrate 105 is representative of fin structures 110; however, planar features are also contemplated herein.

In embodiments, the fin structures 110 can be fabricated using a sidewall image transfer (SIT) technique. In an example of a SIT technique, a mandrel material, e.g., amorphous Si, is deposited on the substrate 105 or a FIN hardmask stack using conventional CVD processes. A resist is formed on the mandrel material, and exposed to light to form a pattern (openings). A reactive ion etching (RIE) is performed through the openings to form the mandrels. In embodiments, the mandrels can have different widths and/or spacing depending on the desired dimensions of the fin structures. Spacers are formed on the sidewalls of the mandrels which are preferably material that is different than the mandrels, and which are formed using conventional deposition processes known to those of skill in the art. The spacers can have a width which matches the dimensions of the fin structures, for example. The mandrels are removed or stripped using a conventional etching process, selective to the mandrel material. An etching is then performed within the spacing of the spacers to form the sub-lithographic features. The sidewall spacers can then be stripped.

Gate structures 115 are formed on the substrate 105, and particularly over active regions. In this way, the gate structures 115 are over an active region of a device. As should be understood, the gate structures 115 are finFET gate structures, but can be planar gate structures for planar embodiments. The gate structures 115 are fabricated using any known gate formation processes, e.g., replacement gate fabrication processes or gate first processes as is known in the art. In embodiments, the gate structures 115 include gate dielectric material and metallization features. The gate dielectric material can be, e.g., a high-k gate dielectric material, e.g., hafnium based dielectrics. In further embodiments, the high-k dielectric materials can include, but are not limited: $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The metallization features, i.e., the gate material 120, can include any workfunction metal or any combination of metals, depending on the particular application and design parameters. For example, in embodiments, the gate material 120 at a very top region can be TiN and tungsten (W) materials. In this way, the gate structures 115 are high-k metal gate structures. Further, the gate structures 115 comprise gate materials, i.e., gate material 120.

Still referring to FIG. 1A, sidewall spacers 125, e.g., a low-k dielectric, is formed on the sidewalls of the gate structures 115. In embodiments, the sidewall spacers 125 extend above the gate materials, i.e., gate material 120. The sidewall spacers 125 can be deposited by conventional chemical vapor deposition (CVD) processes followed by a patterning process, e.g., anisotropic etching process, to remove any material from horizontal surfaces of the structure 100.

Source and drain regions (S/D) regions 130 can be formed on sides of the gate structures 115, e.g., sides of the sidewall spacers 125, in or on the substrate 105 using, e.g., any conventional method. For example, the S/D regions 130 can be raised source and drain regions formed by an epitaxial growth processes with doped Si material as on example. Alternatively, the S/D regions 130 can be formed by an ion implantation process, a doping process or through a diffusion process, as is well known to those of skill in the art such that no further explanation is required for an understanding of the present disclosure. As shown in FIG. 1A, the S/D regions 130 can be raised S/D regions formed by an epi growth on the surfaces of the substrate 105, between the gate structures 115. FIG. 1A further shows an interlevel dielectric (ILD) layer 135 deposited within trenches formed between the gate structures 115 and, more specifically, between the sidewall spacers 125. In embodiments, the (ILD) layer 135 can be deposited by CVD processes and can be composed of oxide, for example, followed by a chemical mechanical planarization (CMP) process.

FIG. 1B shows a sacrificial capping material 145 deposited within the trenches 140, 140a over the gate structures 115. The formation of the trenches 140, 140a is a two-step process in which the sidewall spacers 125 are etched first using a reactive ion etching (RIE) with chemistries that are selective to the ILD layer 135, thereby forming the trench 140. The gate material 120 is etched to form recesses in the gate structures 115. In this way, the gate structures 115 are recessed gate structures. In embodiments, the gate material 120 can be etched using etching processes selective to surrounding materials, e.g., a wet etch process. More specifically, the trenches 140, 140a form a stepped cavity over the gate structures 115, forming a T-shaped trench 140, 140a. In this way, the sacrificial capping material 145 can be a T-shaped cap.

In embodiments, the trenches 140, 140a can have a depth in a range of about 5-30 nm, with each of the trenches 140, 140a having a desired depth of less than or equal to 10 nm. Specifically, the sacrificial capping material 145 can have a height significantly less than conventional sacrificial materials, i.e., less than 55 nm. More specifically, the sacrificial capping material 145 can have a height of about 20 nm. Having a sacrificial capping material 145 with a height less than 55 nm allows for implementation in smaller technology nodes, i.e., 7 nm and beyond.

The sacrificial capping material 145 can be composed of amorphous silicon ($\alpha$-Si). In this way, the sacrificial capping material 145 can be an $\alpha$-Si T-shaped cap. More specifically, the sacrificial layer, i.e., sacrificial capping material 145, is comprised of an amorphous silicon. In further embodiments, it is contemplated that the sacrificial capping material 145 is composed of any material having an etch selectivity different than the sidewall spacers 125 and a capping layer over the S/D regions 130. For example, the sacrificial capping material 145 can be composed of $HfO_2$ or TiN, amongst other examples. The sacrificial capping material 145 can be deposited within the trenches 140, 140a by conventional deposition processes, e.g., CVD processes, followed by a CMP process. In this way, the structures and processes described herein provide for depositing a sacrificial layer, i.e., sacrificial capping material 145, over the gate structures 115 having an etch selectivity different than the sidewall spacers 125.

Figure 2A:
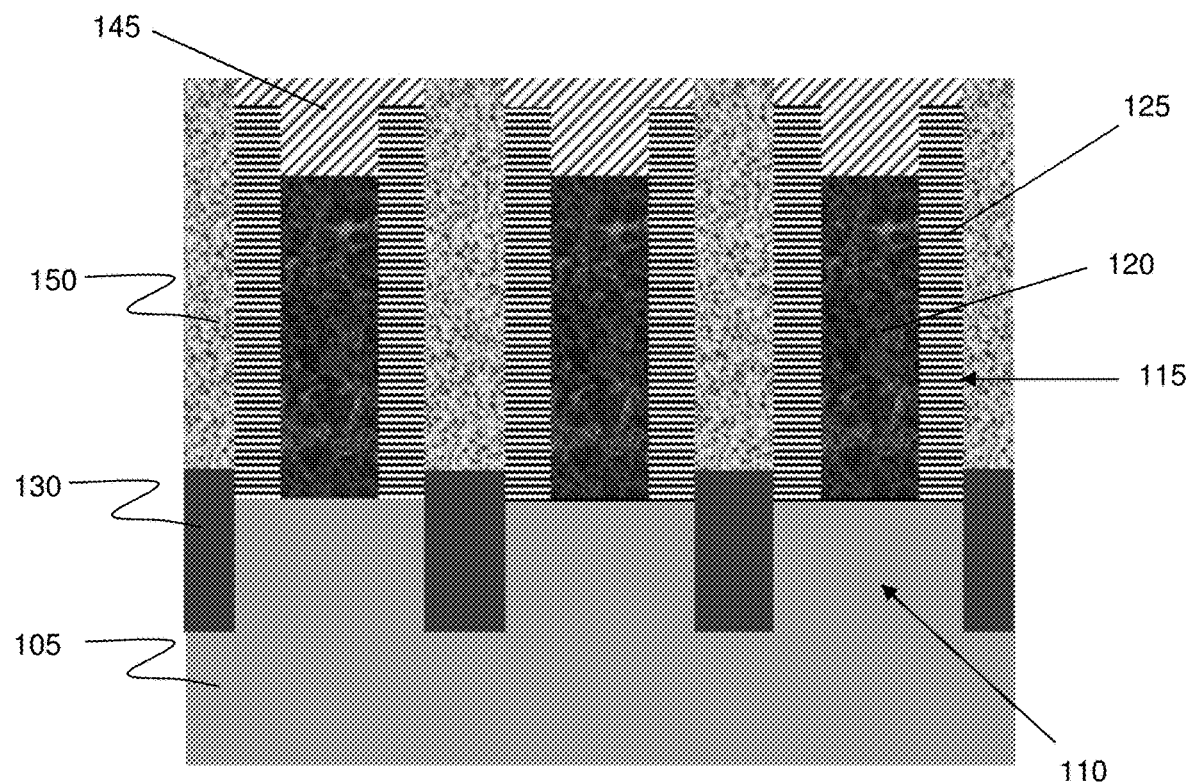
FIGS. 2A and 2B show trench silicide structures, amongst other features, and respective fabrication processes in accordance with aspects of the present disclosure.
Figure 2B:
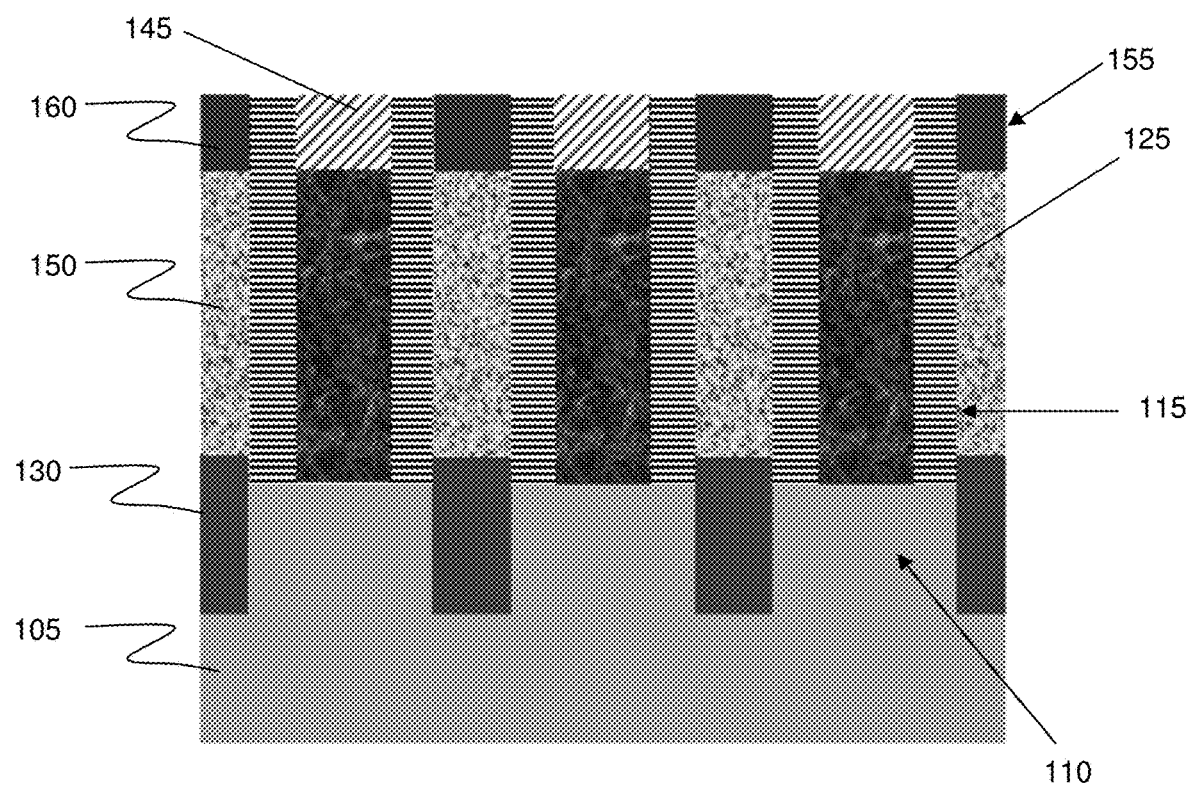

FIGS. 2A and 2B show the formation of trench silicide structures 150. In embodiments, trenches are formed in the ILD layer 135 which expose the S/D regions 130 using conventional lithography and etching techniques, e.g., RIE process. For example, a resist formed over the ILD layer 135 is exposed to energy (light) to form a pattern (opening). An etching process with a selective chemistry, e.g., RIE, will be used to form one or more trenches in the ILD layer 135 through the openings of the resist. The resist can then be removed by a conventional oxygen ashing process or other known stripants. The etch process etches the ILD layer selective to the sacrificial capping layer 145.

A silicide liner is deposited in the trenches over the S/D regions 130 and then subjected to a silicide process. The silicide liner can be deposited using physical vapor deposition (PVD) or CVD processes. In embodiments, the silicide liner can be Ti, Ni, NiPt and Co, amongst other examples. Following the silicide process, a metal material is deposited on the silicide liner, thereby forming the trench silicide structures 150. In embodiments, the metal material can be composed of cobalt (Co) or tungsten (W) or Ruthenium (Ru), for example. In further embodiments, there could be a thin metal liner material deposited before deposition metal of the metal material, e.g. TiN, TaN. The deposition of the metal material is followed by a CMP polishing process down to the sacrificial capping material 145. In this way, the trench silicide structures 150 are over the source and drain regions 130.

FIG. 2B shows the formation of a capping material 160 within the trenches 155 over the trench silicide structures 150. In embodiments, the trenches 155 will have a depth below a top surface of the sidewall spacers 125. More specifically, a capping material 160 is deposited within the trenches 155 using a CVD process followed by a CMP process. In this way, the structures and processes described herein comprise a first cavity, i.e., trenches 155, over selective source and drain regions 130. Further, this first cavity, i.e., trenches 155, over the selective source and drain regions 130 is filled with a capping material 160. FIG. 2B shows the CMP process exposing the sidewall spacers 125.

In embodiments, the capping material 160 can be any suitable capping material, e.g., SiN, SiC, SiO$_2$, or another nitride material, amongst other examples. In this way, a nitride cap, i.e., capping material 160, is over the trench silicide structures 150. In further embodiments, the capping material 160 can be any material having an etch selectivity different than sacrificial capping material 145 and the sidewall spacers 125. More specifically, the capping material 160 has an etch selectivity different than the sacrificial layer, i.e., sacrificial capping material 145. In this way, the structures and processes described herein comprise recessed trench silicide structures 150 over the source and drain regions 130 and between the gate structures 115

Figure 3A:
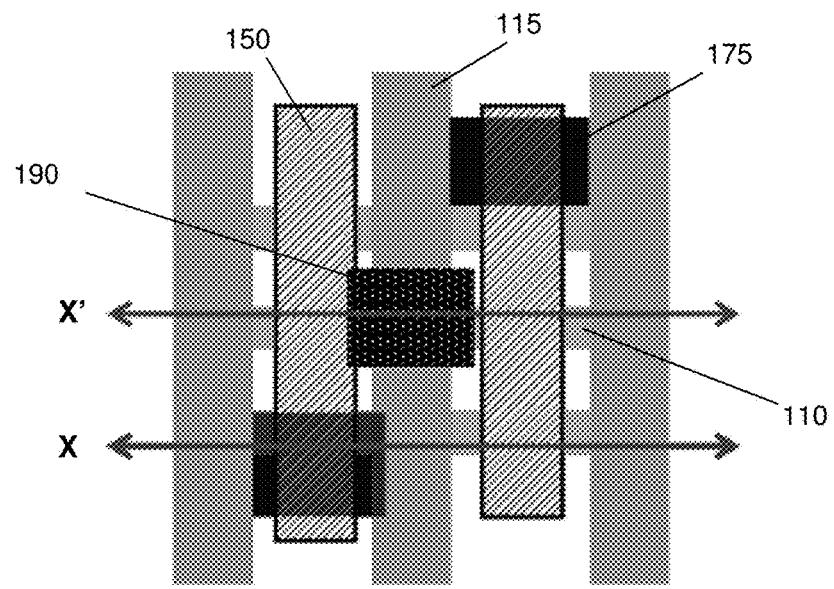
FIGS. 3A-3C show contact structures, amongst other features, and respective fabrication processes in accordance with aspects of the present disclosure.
Figure 3B:
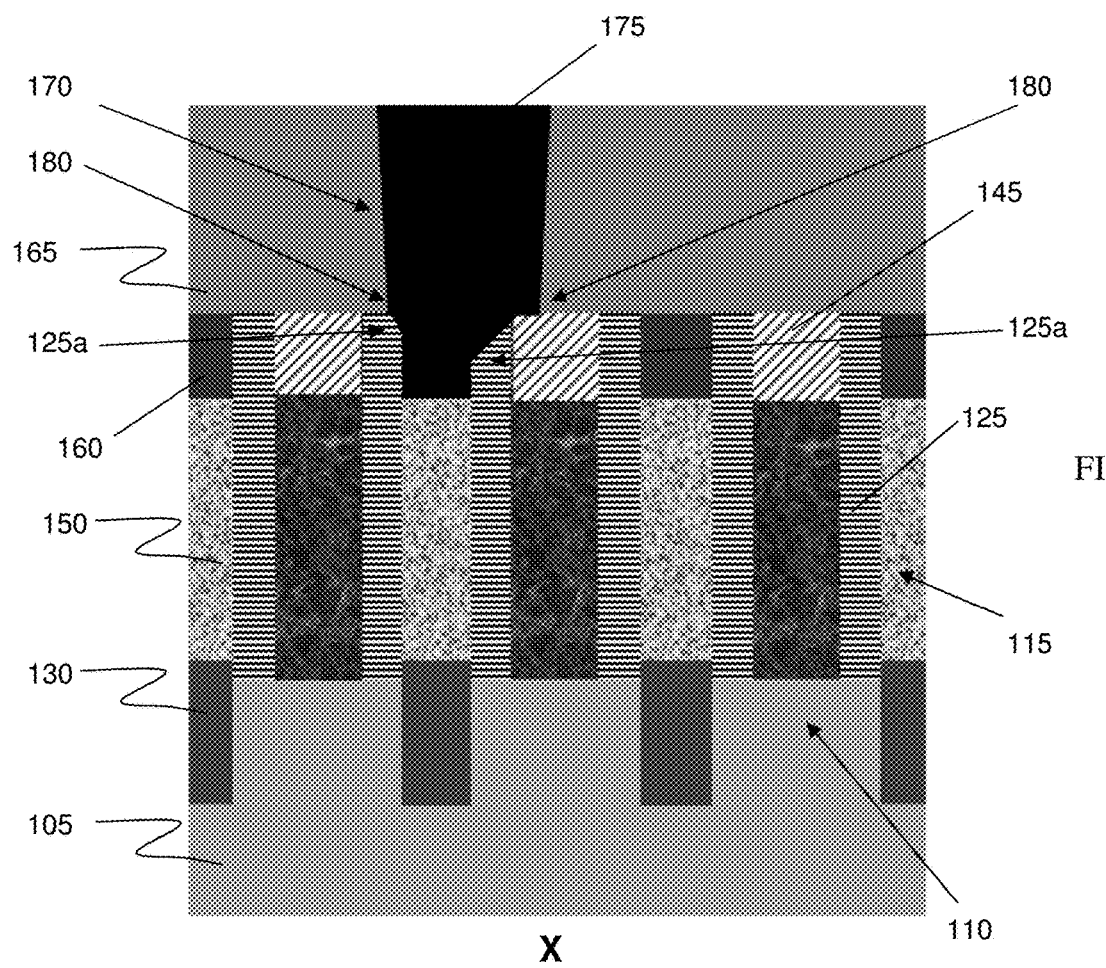
Figure 3C:
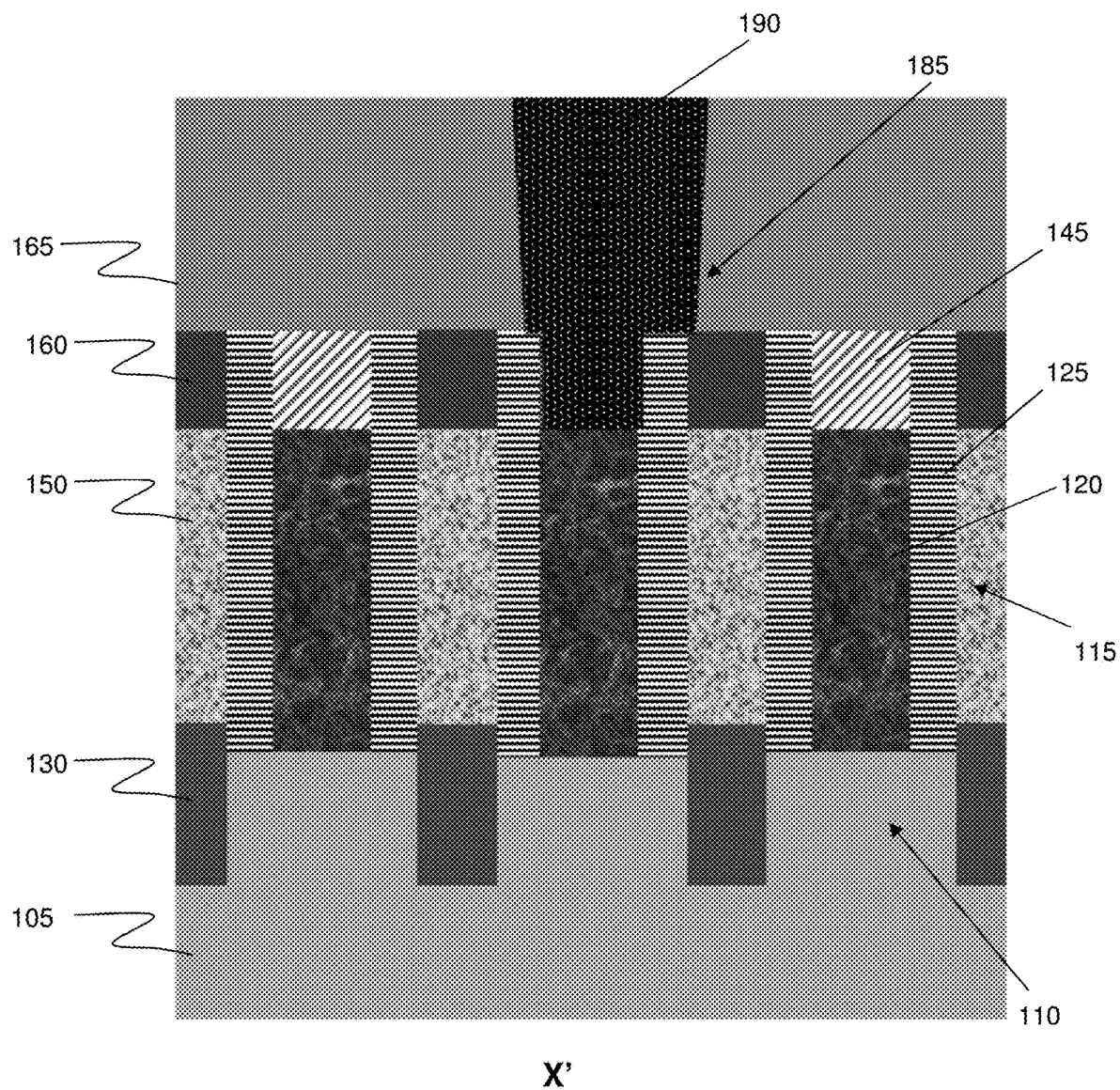

FIGS. 3A-3C show the source and drain (S/D) contact 175 and the gate contact 190. Specifically, FIG. 3A shows a top view of the structure, while FIGS. 3B and 3C show cross-sectional views along lines X-X and X'-X' of FIG. 3A. In embodiments, an ILD layer 165 is deposited directly on the sacrificial capping material 145 and the capping material 160, i.e., over the gate structures 115 and the trench silicide structures 150. Specifically, the structures and processes described herein provide for depositing a dielectric layer, i.e., ILD layer 165, over the sacrificial layer, i.e., sacrificial capping material 145, and the capping material 160. The ILD layer 165 can be comprised of any suitable dielectric material, e.g., oxide, deposited by a CVD process.

A photoresist is formed over the ILD layer 165, and then exposed to energy (light) to form a pattern (opening). An etching process with a selective chemistry, e.g., RIE process, will be used to form one or more trenches 170, 185 in the ILD layer 165 through the openings of the photoresist. In this way, the structures and processes described herein provide for etching a trench 170 in the dielectric layer, i.e., ILD 165, over selective source and drain regions 130. Specifically, FIG. 3B shows the trench 170 exposing the trench silicide structure 150, while the trench 185 exposes the gate material 120, i.e., the gate structure 115.

A metal material is deposited within the trenches 170, 185 to form the contacts 175, 190. More specifically, S/D contact 175 is in direct electrical connection with the S/D regions 130 through the trench silicide structures 150. In addition, the gate contact 190 is in direct electrical connection with the gate structure 115. In this way, the structures and processes described herein provide for removing the sacrificial layer, i.e., sacrificial capping material 145, to expose the gate materials, i.e., gate material 120, and forming a gate contact 190 to selective gate structures 115. Further, the contacts of the at least one gate structure, i.e., gate contact 190, and the at least one metallization feature connecting to the source and drain regions 130, i.e., S/D contact 175, extend below the sidewalls spacers 125. In embodiments, the metal material can be deposited by CVD processes, and can be any suitable conductive material. For example, the metal material can be tungsten (W), cobalt (Co) or copper (Cu), amongst other examples. The deposition of the metal material is followed by a CMP process.

In embodiments, the trench 170 can be misshapen due to an over etching of the capping material 160. More specifically, at least one of the sidewall spacers 125 are over etched, as shown with over-etched sidewall spacers 125a. In this way, the sidewall spacers 125 are over-etched, i.e., over-etched sidewall spacers 125a. Further, the S/D contact 175 can have extending portions 180 which extend over the sidewall spacers 125, and particularly extend over the over-etched sidewall spacers 125a.

Specifically, the source and drain contact 175 is over the over-etched sidewall spacers 125a. However, no shorting occurs since the metal material of the gate structure 115 and the metal material of the S/D contact 175, and particularly the extending portions 180, are kept isolated from one another by the sacrificial capping material 145, in addition to any remaining portion of the sidewall spacers 125. In this way, the structures and processes described herein prevent shorting even if over etching has occurred. More specifically, the structures and processes described herein provide for a plurality of gate structures 115 comprising source and drain regions 130 and spacers 125, contacts, i.e., gate contact 190, connecting to at least one gate structure of the plurality of gate structures 115, and at least one metallization feature, i.e., S/D contact 175, connecting to the source and drain regions 130 and extending, i.e., extending portions 180, over the sidewall spacers 125. In the formation of the trench 185 of FIG. 3C, the sacrificial capping material 145 is etched with a selectivity with respect to the sidewall spacers 125 and the ILD layer 165. Accordingly, the trench silicide structures 150 are fully protected by the capping material 160.

Figure 4A:
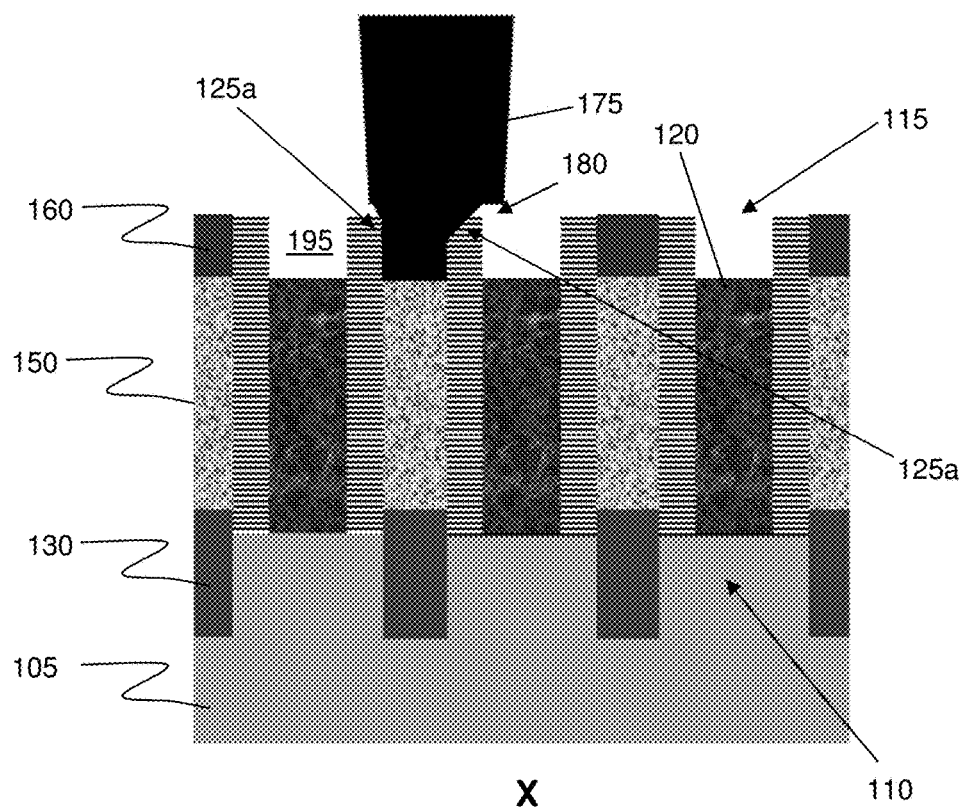
FIGS. 4A and 4B show exposed gate structures, amongst other features, and respective fabrication processes in accordance with aspects of the present disclosure.
Figure 4B:
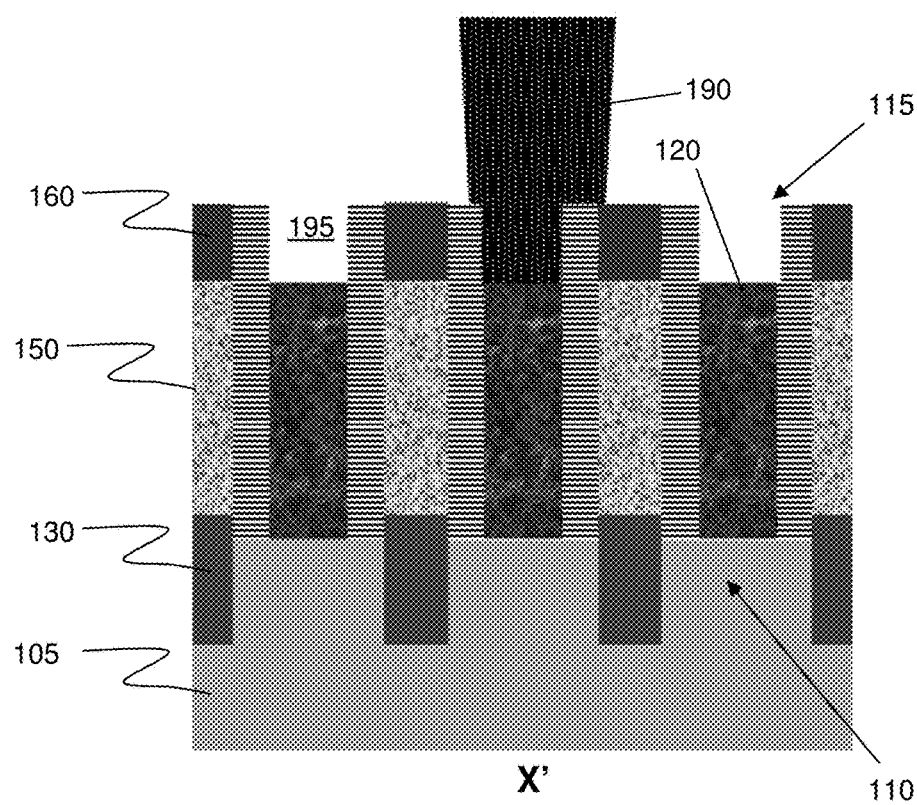

FIGS. 4A and 4B show the removal of the ILD layer 165 and also the removal of the sacrificial capping material 145, forming the trenches 195 which expose the gate material 120 of the gate structures 115. The ILD layer 165 can be removed using etching techniques, e.g., RIE process. The sacrificial capping material 145 can be removed by conventional etching processes, e.g., wet etch process. In embodiments, the etching of the ILD layer 165 and the sacrificial capping material 145 can be a maskless process. As illustrated in FIG. 4A, the extending portions 180 of the S/D contact 175 can extend over the gate material 120.

Figure 5A:
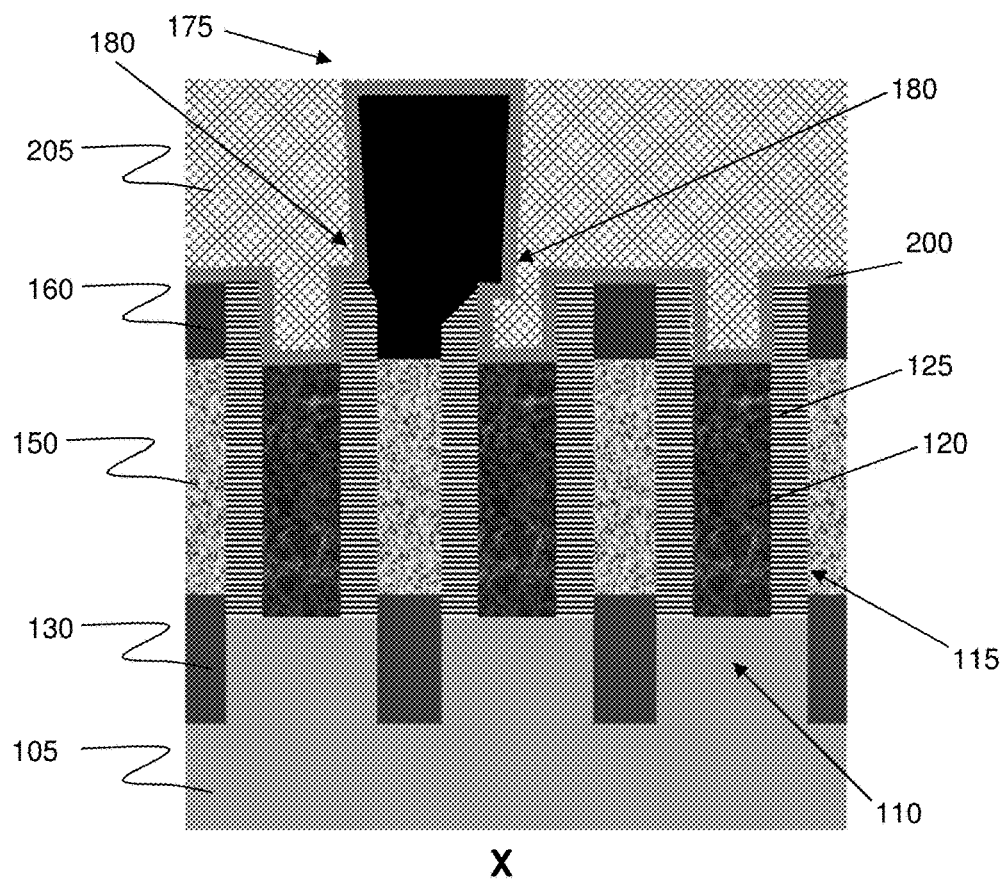
FIGS. 5A and 5B show structures having contacts over active regions, amongst other features, and respective fabrication processes in accordance with aspects of the present disclosure.
Figure 5B:
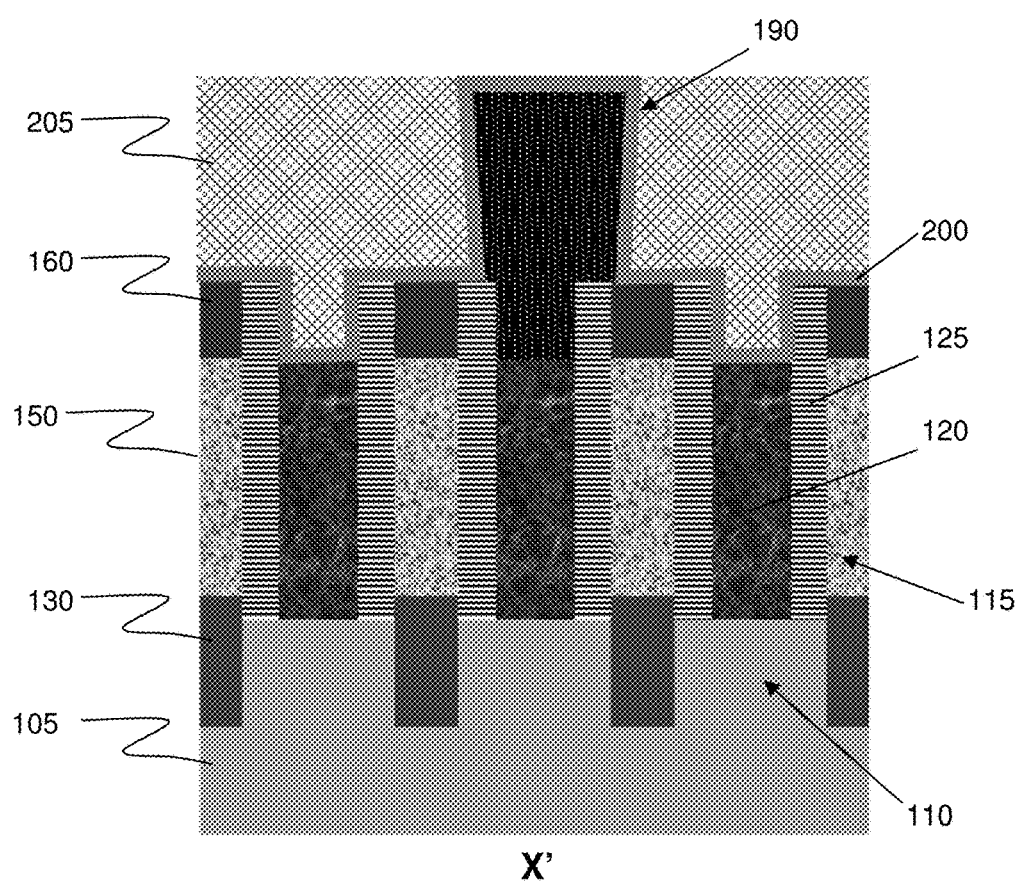

FIGS. 5A and 5B show the deposition of a liner 200 within the trenches 195 and on and/or over the contacts 175, 190, the capping material 160 and the gate structures 115, including the sidewall spacers 125 and the gate material 120. More specifically, the liner 200 is over sidewalls of the contacts of the at least one gate structure, i.e., gate contact 190, and the at least one metallization feature, i.e., S/D contact 175. In this way, the structures and processes described herein provide for forming a liner 200 over the gate structures 115 and the source and drain regions 130. In embodiments, the liner 200 can be deposited by conventional deposition processes, e.g., CVD. In further embodiments, the liner 200 can be a nitride material, for example.

In embodiments, the liner can be composed of an appropriate low-k material. In this way, the structures and processes described herein provide a gate structure 115 comprising over-etched sidewall spacers 125a, source and drain regions 130, and a gate contact 190, a misaligned source and drain contact, i.e., S/D contact 175, connecting to the source and drain regions 130 and extending, i.e., extending portions 180, over the over-etched sidewall spacers 125a, and a liner

200 over the gate contacts, i.e., gate contact 190, and the misaligned source and drain contact, i.e., S/D contact 175.

The deposition of the liner 200 is followed by the deposition of the ILD layer 205, which is deposited by conventional deposition processes, e.g., CVD. Specifically, the structures and processes described herein comprise a second cavity, i.e., trenches 195, over selective gate structures 115. Further, this second cavity, i.e., trenches 195, is filed with a liner 200 and a dielectric material, i.e., ILD layer 205. In this way, the gate structures 115 are protected from the S/D contact 175, including the extending portions 180 of the S/D contact 175, by the liner 200 and the ILD layer 205. In further embodiments, the extending portions 180 are covered by the liner 200 and the ILD layer 205.

It should now be understood that the processes and resultant structures described herein will serve to further protect the metallization features of the gate structure during fabrication processes for smaller technology nodes. Specifically, by implementing a sacrificial capping material with an etch selectivity different than the sidewall spacers of the gate structure and other capping materials, shorting will be prevented between the metallization features of the gate structures and the metallization features of the source and drain regions, even if an over etching occurs.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
   a plurality of gate structures comprising gate materials, source and drain regions and sidewall spacers;
   contacts connecting to at least one gate structure of the plurality of gate structures; and
   at least one misaligned metallization feature connecting to at least one of the source and drain regions,
   wherein the at least one misaligned metallization feature is directly above a top surface of the sidewall spacers and above top surfaces of the gate materials,
   wherein an upper surface of each of the sidewall spacers, in contact with the at least one misaligned metallization feature, is chamfered,
   wherein the at least one misaligned metallization feature is formed over a trench silicide structure connecting the at least one misaligned metallization feature to the at least one of the source and drain regions, and
   wherein the at least one misaligned metallization feature completely covers the chamfered upper surface of one of the sidewall spacers on one side of the trench silicide structure, and partially covers the chamfered upper surface of another one of the sidewall spacers on an opposite side of the trench silicide structure.

2. The structure of claim 1, wherein the gate structures are over an active region of a device.

3. The structure of claim 1, wherein the contacts of the at least one gate structure and the at least one misaligned metallization feature connecting to the source and drain regions extend below the sidewalls spacers.

4. The structure of claim 1, further comprising recessed trench silicide structures over the source and drain regions and between the gate structures.

5. The structure of claim 4, wherein at least one of the sidewall spacers are over etched.

6. The structure of claim 1, wherein the sidewall spacers extend above the gate materials.

7. The structure of claim 6, further comprising a first cavity over selective source and drain regions and a second cavity over selective gate structures.

8. The structure of claim 7, wherein the first cavity over the selective source and drain regions is filled with a capping material.

9. The structure of claim 8, wherein the second cavity over the selective gate structures is filled with a liner and a dielectric material.

10. The structure of claim 9, wherein the liner is over sidewalls of the contacts of the at least one gate structure and the at least one misaligned metallization feature.

11. A structure, comprising:
    a gate structure comprising a gate material, over-etched sidewall spacers, source and drain regions, and a gate contact;
    a misaligned source and drain contact connecting to one of the source and drain regions, wherein the misaligned source and drain contact is directly above top surfaces of the over-etched sidewall spacers and is directly above a top surface of the gate material; and
    a liner over the gate contact and the misaligned source and drain contact,
    wherein an upper surface of each of the over-etched sidewall spacers, in contact with the misaligned source and drain contact, is chamfered,
    wherein the misaligned source and drain contact is formed over a trench silicide structure connecting the misaligned source and drain contact to the one of the source and drain regions, and
    wherein the misaligned source and drain contact completely covers the chamfered upper surface of one of the over-etched sidewall spacers on one side of the trench silicide structure, and partially covers the chamfered upper surface of another one of the over-etched sidewall spacers on an opposite side of the trench silicide structure.

12. The structure of claim 11, wherein the liner is comprised of a nitride material.

13. The structure of claim 11, further comprising trench silicide structures over the source and drain regions.

14. The structure of claim 13, further comprising a nitride cap over the trench silicide structures.

15. The structure of claim 11, wherein the gate contact is a misaligned gate contact.

16. The structure of claim 15, wherein the misaligned gate contact completely covers an upper surface of one of the over-etched sidewall spacers on one side of the gate material and partially covers an upper surface of another of the over-etched sidewall spacers on an opposite side of the gate material.

17. The structure of claim 16, further comprising:
additional trench silicide structures over other ones of the source and drain regions; and
a nitride cap over the trench silicide structures,
wherein the liner is comprised of a nitride material,
wherein the misaligned source and drain contact is at least one selected from a group consisting of: tungsten; cobalt; and copper, and
wherein the gate contact extends below the sidewall spacers.

* * * * *